US011417591B2

(12) United States Patent
Sawada et al.

(10) Patent No.: US 11,417,591 B2
(45) Date of Patent: Aug. 16, 2022

(54) SEMICONDUCTOR MODULE

(71) Applicant: SUMITOMO ELECTRIC INDUSTRIES, LTD., Osaka (JP)

(72) Inventors: Kenichi Sawada, Osaka (JP); Jiro Shinkai, Osaka (JP); So Tanaka, Osaka (JP); Hirotaka Oomori, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 107 days.

(21) Appl. No.: 16/977,577

(22) PCT Filed: Jan. 22, 2019

(86) PCT No.: PCT/JP2019/001793
§ 371 (c)(1),
(2) Date: Sep. 2, 2020

(87) PCT Pub. No.: WO2019/171795
PCT Pub. Date: Sep. 12, 2019

(65) Prior Publication Data
US 2021/0013130 A1 Jan. 14, 2021

(30) Foreign Application Priority Data
Mar. 8, 2018 (JP) ............................ JP2018-042050

(51) Int. Cl.
*H01L 23/00* (2006.01)
*H01L 23/498* (2006.01)
(Continued)

(52) U.S. Cl.
CPC ............ *H01L 23/498* (2013.01); *H01L 23/04* (2013.01); *H01L 24/32* (2013.01); *H01L 24/83* (2013.01);
(Continued)

(58) Field of Classification Search
CPC ....... H01L 23/498; H01L 23/04; H01L 24/32; H01L 24/83; H01L 23/24;
(Continued)

(56) References Cited

U.S. PATENT DOCUMENTS

2013/0094165 A1 4/2013 Yano et al.
2015/0380331 A1 12/2015 Inaba

FOREIGN PATENT DOCUMENTS

JP 2017-092185 5/2017
JP 2018-019110 2/2018
(Continued)

*Primary Examiner* — Elias Ullah
(74) *Attorney, Agent, or Firm* — IPUSA, PLLC

(57) ABSTRACT

A semiconductor module includes: a circuit board; a semiconductor chip having a first electrode pad on a first surface, bonded to the circuit board at a second surface that is opposite to the first surface, and having side surfaces intersecting the first surface and the second surface; an external terminal electrically connected to the first electrode pad; and an insulating member configured to fix the external terminal, wherein by the insulating member contacting the side surfaces of the semiconductor chip at a plurality of locations, parallel movement and rotational movement of the semiconductor chip relative to the insulating member in a plane parallel, to the first surface are restricted, and wherein the external terminal penetrates the insulating member.

9 Claims, 12 Drawing Sheets

(51) Int. Cl.
*H01L 23/04* (2006.01)
*H01L 23/24* (2006.01)

(52) U.S. Cl.
CPC .... *H01L 23/24* (2013.01); *H01L 2224/32225* (2013.01); *H01L 2224/83801* (2013.01)

(58) Field of Classification Search
CPC . H01L 2224/32225; H01L 2224/83801; H01L 24/06; H01L 24/92; H01L 2224/04; H01L 2224/04026; H01L 24/80; H01L 24/29; H01L 2224/29101; H01L 2224/80007; H01L 2224/80138; H01L 2224/83447; H01L 24/01; H01L 2224/0603
See application file for complete search history.

(56) References Cited

FOREIGN PATENT DOCUMENTS

| | | |
|---|---|---|
| WO | 2013/054408 | 4/2013 |
| WO | 2015/016017 | 2/2015 |

SEMICONDUCTOR MODULE

TECHNICAL FIELD

The present disclosure relates to a semiconductor module.

The present application is based on and claims priority to Japanese Patent Application No. 2018-042050, filed on Mar. 8, 2018, the entire contents of the Japanese Patent Application are hereby incorporated herein by reference.

BACKGROUND ART

Semiconductor modules having semiconductor chips that enable large currents to flow are used in electric vehicles and other power applications. In semiconductor modules, rod-shaped external terminals may be connected to electrode pads of semiconductor chips.

PRIOR ART DOCUMENT

Patent Document

[Patent Document 1] Japanese Laid-open Patent Publication No. 2017-92185

SUMMARY OF THE INVENTION

According to one aspect of the present embodiment, a semiconductor module includes: a circuit board; a semiconductor chip having a first electrode pad on a first surface, bonded to the circuit board at a second surface that is opposite to the first surface, and having side surfaces intersecting the first surface and the second surface; an external terminal electrically connected to the first electrode pad; and an insulating member configured to fix the external terminal. By the insulating member contacting the side surfaces of the semiconductor chip at a plurality of locations, parallel movement and rotational movement of the semiconductor chip relative to the insulating member in a plane parallel to the first surface are restricted. The external terminal penetrates the insulating member.

EMBODIMENT FOR CARRYING OUT THE INVENTION

Figure 1:
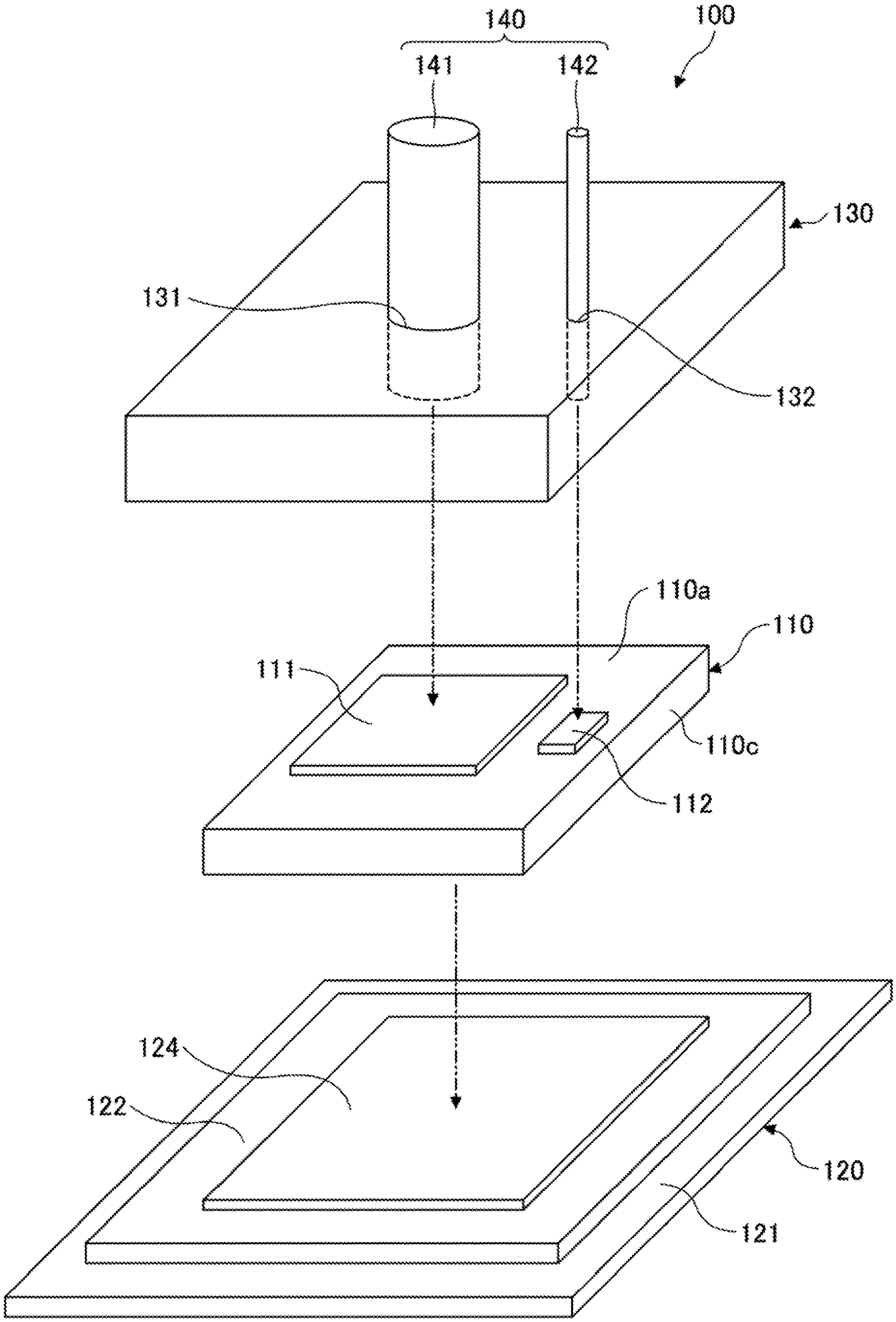
FIG. 1 is an exploded perspective view illustrating a semiconductor module according to a first embodiment.

In recent years, enhancements in semiconductor chips have enabled further miniaturization of semiconductor chips that enables large currents to flow. However, upon miniaturizing an external terminal along with the miniaturization of a semiconductor chip, the current that flows through the external terminal is limited. Also, upon miniaturizing a semiconductor chip while using an external terminal having a size that enables a large current to flow, due to a positional deviation between the external terminal and an electrode pad, a problem such as a bonding failure and a short circuit may occur.

Therefore, the present disclosure has an object to provide a semiconductor module in which it is possible to prevent a positional deviation between an external terminal and an electrode pad from occurring easily.

According to the present disclosure, it is possible to prevent a positional deviation between an external terminal and an electrode pad from occurring easily.

Embodiments will be described below.

DESCRIPTION OF EMBODIMENTS OF THE PRESENT DISCLOSURE

First, aspects of the present disclosure will be described by listing. In the following description, the same numerals are used to denote the same or corresponding elements; accordingly, explanation for those elements will not be repeatedly provided.

[1] A semiconductor module according to one aspect of the present disclosure includes: a circuit board; a semiconductor chip having a first electrode pad on a first surface, bonded to the circuit board at a second surface that is opposite to the first surface, and having side surfaces intersecting the first surface and the second surface; an external, terminal electrically connected to the first electrode pad; and an insulating member configured to fix the external terminal, wherein by the Insulating member contacting the side surfaces of the semiconductor chip at a plurality of locations, parallel movement and rotational movement of the semiconductor chip relative to the insulating member in a plane parallel to the first surface are restricted, and wherein the external terminal penetrates the insulating member.

Although further miniaturization of a semiconductor chip that enables a large current to flow is possible, when an external terminal is also miniaturized along with the miniaturization of the semiconductor chip, a current that flows through the external terminal is limited. Accordingly, it is desirable to miniaturize a semiconductor chip while using an external terminal having a size that enables a large current to flow. In this case, due to a positional deviation between the external terminal and an electrode pad, a problem such as a bonding failure and a short circuit may occur. As a result of earnest, consideration, the inventors have found a semiconductor module having a structure that enables a large current to flow and in which a positional deviation between an external terminal and an electrode pad does not easily occur. The present disclosure is based on such consideration made by the inventors.

[2] The first surface of the semiconductor chip is covered by the insulating member, and the external terminal penetrates the insulating member in a direction perpendicular to the first surface. It is easy to stabilize the connection between the external terminal and the first electrode pad.

[3] A surface of the external terminal to be in contact with the first electrode pad has a shape similar to a shape of a surface of the first electrode pad to be in contact with the external terminal. It is possible to increase the cross-sectional area of the external terminal with respect to a direction in which a current flows and it is possible to cause a larger current to flow.

[4] The insulating member is in contact with the side surfaces over an entire periphery of the semiconductor chip. The side surfaces can be protected by the insulating member over the entire periphery.

[5] A planar shape of the semiconductor chip is a quadrilateral, and the insulating member is in contact with at least one location for each of the side surfaces corresponding to respective sides of the quadrilateral. Stability excellent in positional accuracy can be obtained.

[6] The circuit board has a circuit pattern on a surface toward the semiconductor chip, the semiconductor chip has a second electrode pad on the second surface, and the second electrode pad is electrically connected to the circuit pattern. It can be applied to a semiconductor module including a vertical semiconductor chip.

[7] The semiconductor chip is made of a material including SiC. The semiconductor chip using SIC is suitable for miniaturization.

[8] A semiconductor module according to another aspect of the present disclosure includes: a circuit board; a semiconductor chip having a main electrode pad and a control electrode pad on a first surface, bonded to the circuit board at a second surface that is opposite to the first surface, and having side surfaces intersecting the first surface and the second surface; a main terminal electrically connected to the main electrode pad; a control terminal electrically connected to the control, electrode pad; and an insulating member configured to fix the main terminal and the control terminal, wherein the first surface of the semiconductor chip is covered by the insulating member, wherein by the insulating member contacting an entire periphery of the side surfaces of the semiconductor chip, parallel movement and rotational movement of the semiconductor chip relative to the insulating member in a plane parallel to the first surface are restricted, and wherein the main terminal and the control terminal penetrate the insulating member in a direction perpendicular to the first surface.

Details of Embodiments of The Present Disclosure

In the following, embodiments of the present disclosure will be described in detail, but the present embodiments are not limited thereto.

First Embodiment

Figure 2:
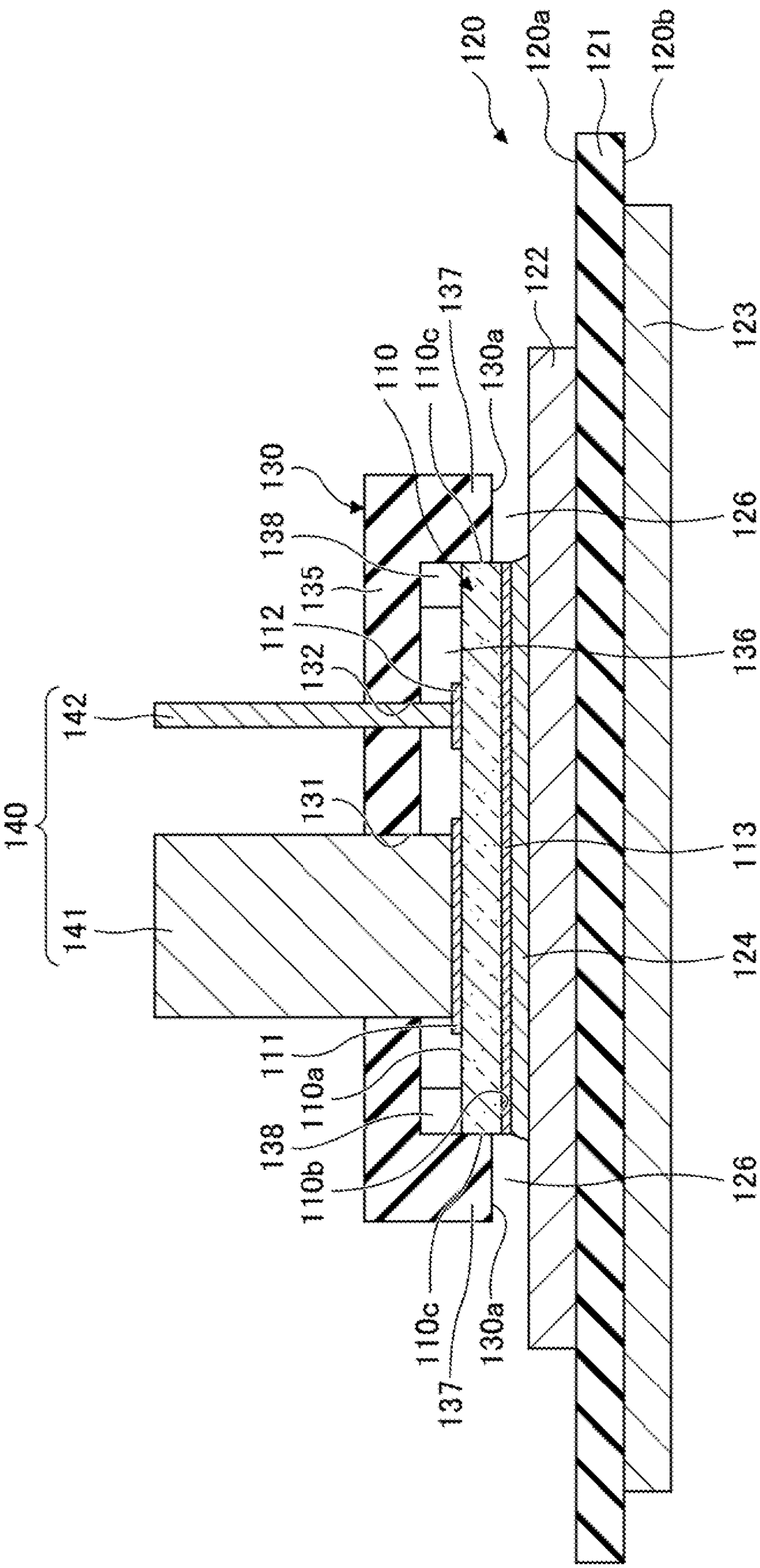
FIG. 2 is a cross-sectional view illustrating the semiconductor module according to the first embodiment.

First, a first embodiment will be described. FIG. 1 is an exploded perspective view illustrating a semiconductor module according to the first embodiment. FIG. 2 is a cross-sectional view illustrating the semiconductor module according to the first embodiment.

As illustrated in FIG. 1 and FIG. 2, the semiconductor module 100 according to the first embodiment includes a semiconductor chip 110, a circuit board 120, an insulating member 130, and an external terminal 140.

The semiconductor chip 110 is made, for example, of Si or SIC. On a first surface 110*a* that is one surface, a main electrode pad 111 and a control electrode pad 112 are provided, and on a second surface 110*b* that is the other surface, a main electrode pad 113 is provided. It should be noted that from the viewpoint of size reduction and efficiency, it is preferable that the semiconductor chip 110 is made of SiC. The main electrode pad 111, the control electrode pad 112 and the main electrode pad 113 are made of, for example, aluminum (Al) or the like. The semiconductor chip 110 is, for example, a MOSFET (Metal-Oxide-Semiconductor Field Effect Transistor), and the main electrode pad 111 is a source electrode pad, the control electrode pad 112 is a gate electrode pad, and the main electrode pad 113 is a drain electrode pad. The semiconductor chip 110 may be an IGBT (Insulated Gate Bipolar Transistor). In a case in which the semiconductor chip 110 is an IGBT, the main electrode pad 111 is an emitter electrode pad, the control electrode pad 112 is a gate electrode pad, and the main electrode pad 113 is a collector electrode pad. The shape of the semiconductor chip 110 is not particularly limited. For example, the semiconductor chip 110 has a planar shape of a square of 3 Hm3 mm, 5 mm*5 mm, or 10 mm*10 mm, and the thickness of the semiconductor chip 110 is 100 μm to 500 μm.

The circuit board 120 includes an insulator substrate 121 made of an insulator, a metal layer 122 that is a wiring layer formed on the first surface 120*a* that is one surface, and a metal layer 123 that is a heat dissipation layer formed on the second surface 120*b* that is the other surface. The metal layer 122 has a circuit pattern, and to the metal layer 122, the main electrode pad 113 of the semiconductor chip 110 is electrically connected by a bonding material 124, such as solder.

For example, the insulator substrate 121 is made of an insulator material such as ceramics, and the metal layers 122 and 123 are made of Cu (copper) or the like.

Figure 3A:
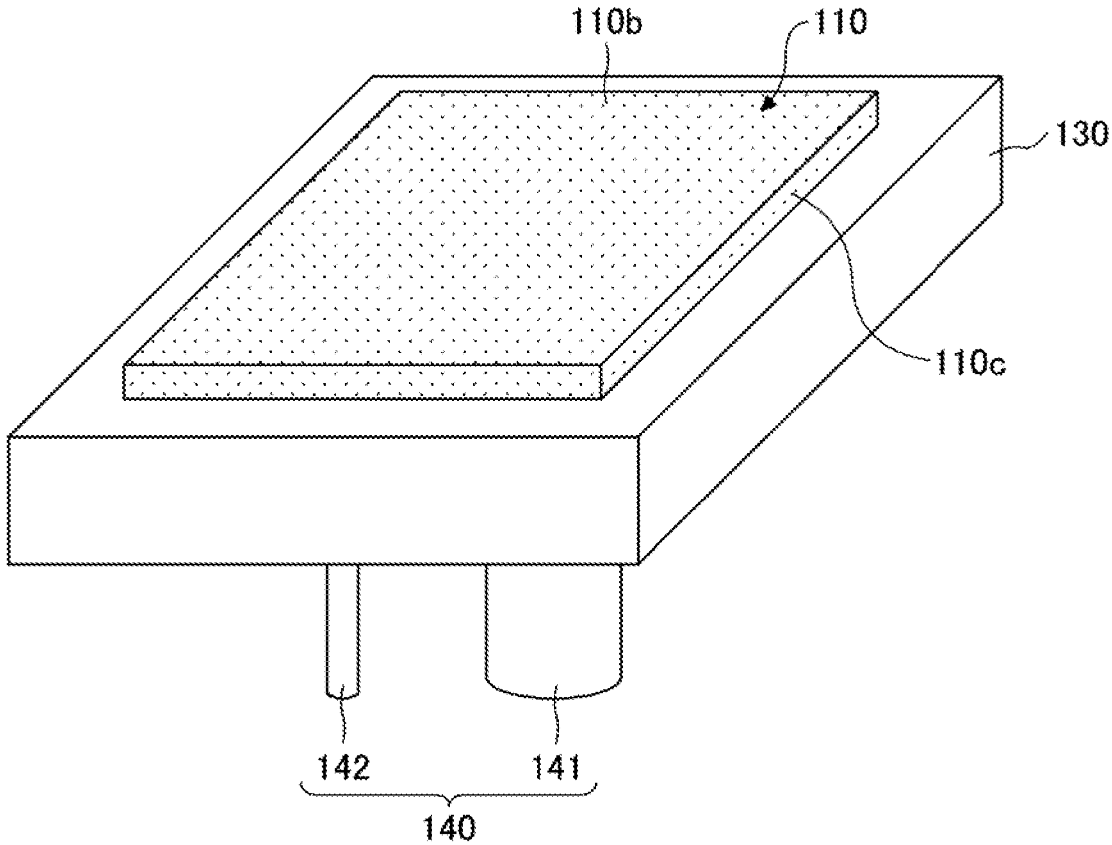
FIG. 3A is a perspective view illustrating the semiconductor chip, the insulating member, and the external terminal according to the first embodiment.
Figure 3B:
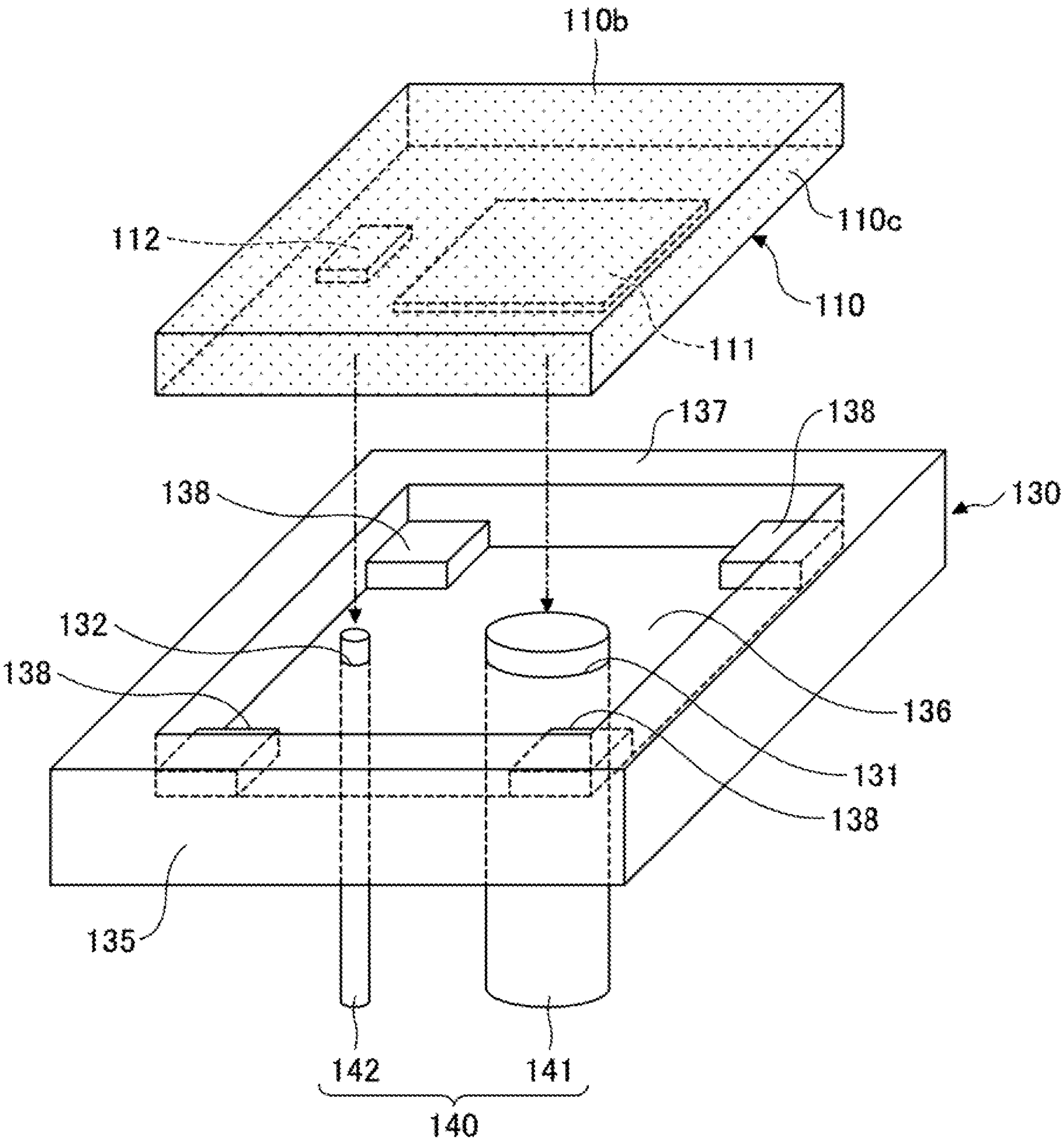
FIG. 3B is an exploded perspective view illustrating the semiconductor chip, the insulating member, and the external terminal according to the first embodiment.

FIG. 3A is a perspective view illustrating the semiconductor chip, the insulating member, and the external terminal according to the first embodiment, and FIG. 33 is an exploded perspective view illustrating the semiconductor chip, the insulating member, and the external terminal according to the first embodiment. FIG. 3A and FIG. 3B are vertically inverted from FIG. 1 and FIG. 2. The insulating member 130 includes a flat plate-shaped base portion 135, a guide portion 137 that is provided on the base portion 135 with an opening portion 136, and four stoppers 138 that are provided on the base portion 135 within the opening portion 136. The opening portion 136 is formed so that Its planar shape matches the planar shape of the semiconductor chip 110. For example, the planar shape of the semiconductor chip 110 is rectangular, and the opening portion 136 has a rectangular planar shape such that the four side surfaces of the opening portion 136 contact the four side surfaces 110*c* of the semiconductor chip 110. That is, the insulating member 130 contacts the side surfaces 110*c* of the semiconductor chip 110 over the entire periphery, and parallel movement and rotational movement of the semiconductor chip 110 relative to the insulating member 130 in a plane parallel to the first surface 110*a* are restricted. The stoppers 138 are arranged at the respective four corners of the opening portion 136. A main terminal through hole 131 that faces the main electrode pad 111 and a control terminal through hole 132 that faces the control electrode pad 112 are formed in the base portion 135.

The external terminal 140 includes, for example, a main terminal 141 and a control terminal 142 that are, for example, cylindrical. The main terminal 141 is fixed to the insulating member 130 by penetrating the main terminal through hole 131 and is electrically connected to the main electrode pad 111 by unillustrated solder or the like. The control terminal 142 is fix to the insulating member 130 by penetrating the control terminal through hole 132 and is electrically connected to the control electrode pad 112 by unillustrated solder or the like.

The stoppers 138 may, for example, have a height such that the sum of the height of the stoppers 138 and the height of the semiconductor chip 110 is greater than or equal to the depth of the opening portion 136. Accordingly, the second surface 110*b* of the semiconductor chip 110 is flush with the end surface 130*a* of the guide portion 137 that, is on the circuit board 120 side, or is on the circuit board 120 side with respect to the end surface 130*a*. The height by which the semiconductor chip 110 protrudes from the base portion 135 is, for example, less than or equal to ½ of the thickness of semiconductor chip 110. In a case in which the semiconductor chip 110 protrudes from base portion 135, there is a gap 126 between the end surface 130*a* and the circuit board 120.

For example, the insulating member 130 is made of ceramics such as alumina or an organic resin such as polyphenylene sulfide (PPS), and the external terminal 140 is made of Cu (copper) or the like.

(Method of Manufacturing Semiconductor Module)

Next, a method of manufacturing the semiconductor module 100 will be described. FIG. 4A to FIG. 4D are cross-sectional views illustrating the method of manufacturing the semiconductor module 100.

Figure 4A:
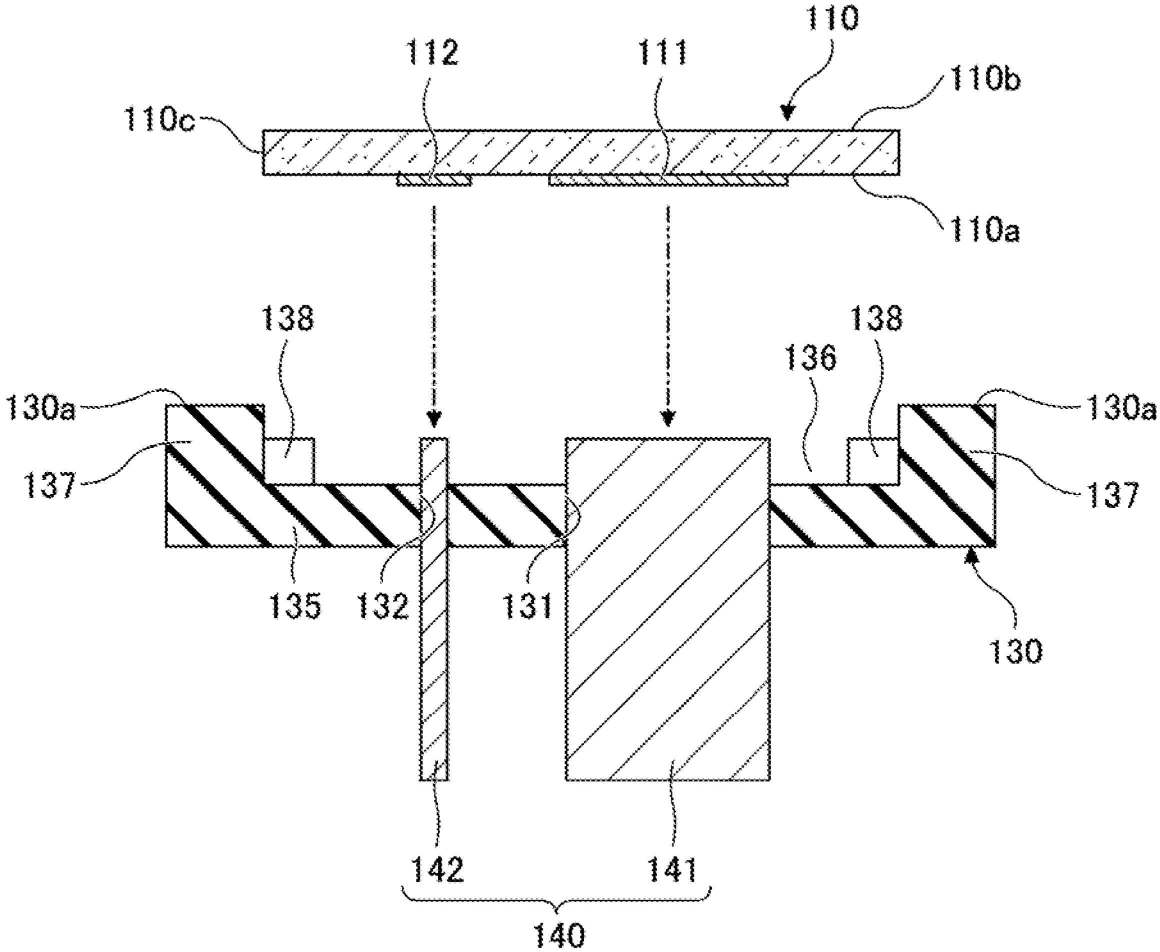
FIG. 4A is a cross-sectional view illustrating a method of manufacturing the semiconductor module according to the first embodiment (part 1)

First, the semiconductor chip 110, the circuit board 120, the insulating member 130, and the external terminal 140 are prepared. Then, as illustrated in FIG. 4A, the main terminal 141 is fitted into the main terminal through hole 131 and the control terminal 142 is fitted into the control terminal through hole 132. At this time, the sum of the height by which the main terminal 141 and the control terminal 142 protrude front the bottom surface of the opening 1 portion 36 within the opening portion 136 and the height of the main electrode pad 111 or the control electrode pad 112 is greater than the height of the stoppers 133. The insulating member 130 and the external terminals 140 may be integrally formed rather than individually prepared. Next, the semiconductor chip 110 is positioned above the base portion 135 such that the main electrode pad 111 faces the main terminal through hole 131 and the main terminal 141 and the control electrode pad 112 faces the control terminal through hole 132 and the control terminal 142. Also, unillustrated solder or the like is provided on the main terminal 141 or the main electrode pad 111, and unillustrated solder or the like is provided on the control terminal 142 or the control electrode pad 112. Examples of solder materials include Sn alloys such as SnSb and SnCu. This state corresponds to the state that is illustrated in FIG. 3B.

Figure 4B:
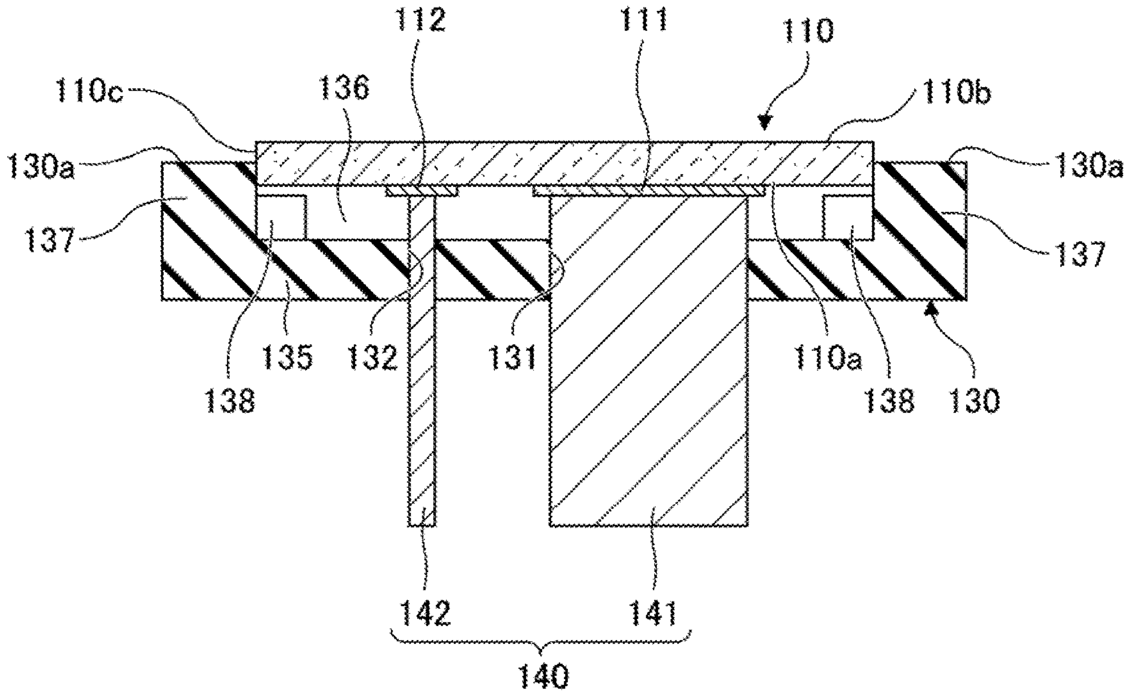
FIG. 4B is a cross-sectional view illustrating the method of manufacturing the semiconductor module according to the first embodiment (part 2)
Figure 4C:
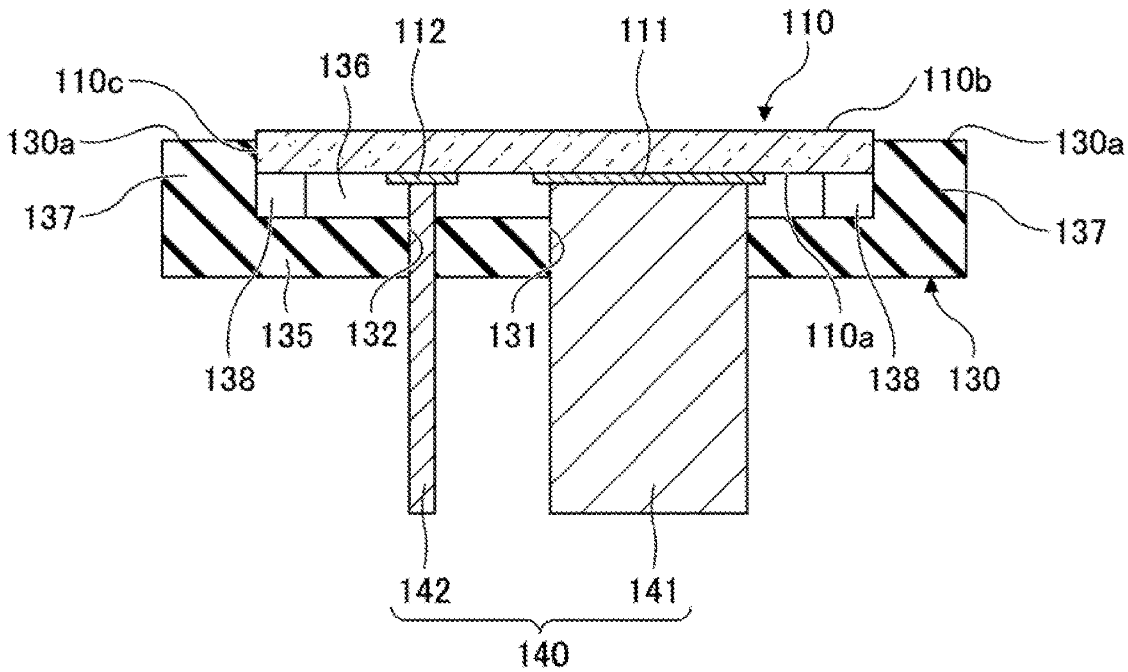
FIG. 4C is a cross-sectional view illustrating the method of manufacturing the semiconductor module according to the first embodiment (part 3)

The semiconductor chip 110 is then fitted into the opening portion 136 as illustrated in FIG. 4B. As a result, the main terminal 141 contacts the main electrode pad 111 via the unillustrated solder or the like, and the control terminal 142 contacts the control electrode pad 112 via the unillustrated solder or the like.

Then, as illustrated in FIG. 40, the semiconductor chip 110 is pushed into the opening portion 136 until the four corners of the first surface 110*a* of the semiconductor chip 110 respectively contact the stoppers 138. As a result, while the main electrode pad 111 and the control electrode pad 112 are pressed, the main terminal 141 more firmly contacts the main electrode pad 111 and the control terminal 142 more firmly contacts the control electrode pad 112. This state corresponds to the state that is illustrated in FIG. 3A.

Figure 4D:
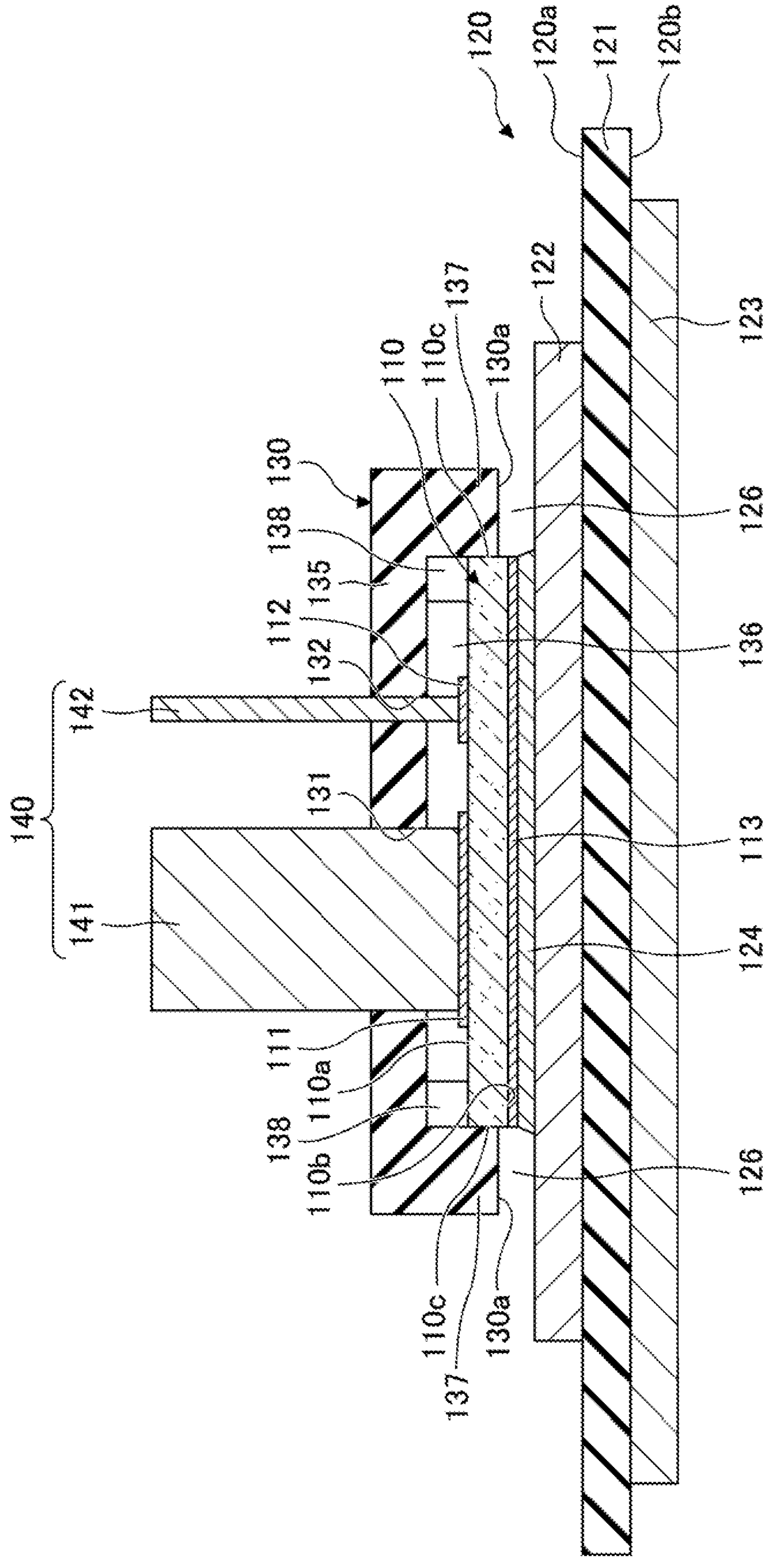
FIG. 4D is a cross-sectional view illustrating the method of manufacturing the semiconductor module according to the first embodiment (part 4)

Then, as illustrated in FIG. 4D, the insulating member 130, in which the semiconductor chip 110 and the external terminal 140 have been fitted, is vertically inverted, the bonding material 124 is provided on the metal layer 122 of the circuit board 120, and the semiconductor chip 110 is mounted on the bonding material 124. Examples of the material of the bonding material 124 include an Sn alloy such as SnSb or SnCu. Then, by performing a heat treatment, the metal layer 122 and the main electrode pad 113 are bonded, the main terminal 141 is bonded to the main electrode pad ill, and the control terminal 142 is bonded to the control electrode pad 112. The temperature of the heat treatment is, for example, 230° C. to 250° C. The heat treatment may be performed for a short period of time at a temperature of about 280° C.

In this manner, the semiconductor module 100 according to the first embodiment can be manufactured.

In the first embodiment as described above, the semiconductor chip 110 is guided by the guide portion 137 of the insulating member 130 to which the main terminal 141 and the control terminal 142 are fixed, the main electrode pad 111 contacts the main terminal 141 and the control electrode pad 112 contacts the control terminal 142. Accordingly, the position of the main terminal 141 can be adjusted with respect to the main electrode pad 111 with high accuracy and the position of the control terminal 142 can be adjusted with respect to the control electrode pad 112 with high accuracy. In particular, because the planar shape of the semiconductor chip 110 is a quadrilateral, and the insulating member 130 is in contact with the respective side surfaces 110*c*, stability excellent in positional accuracy is obtained.

Also, because the insulating member 130 is in contact with the side surfaces 110*c* of the semiconductor chip 110, the side surfaces 110*c*, where high voltage is particularly likely to occur, can be insulation-protected. In sealing using resin, air bubbles or voids may occur in the resin. Therefore, the insulating member 130 can be used for a more reliable insulation protection. Further, at the time of fitting the semiconductor chip 110 into the opening portion 136, by applying a flowable insulating material, such as silicone rubber, to the side surfaces 110*c* of the semiconductor chip 110 or the Inside surface of the guide portion 137, it is possible to further firmly protect the side surfaces 110*c*. It should be noted that even though there is a gap 126 between the end surface 130*a* and the circuit board 120, this gap 126 is small and can also be embedded by using an insulating material such as a sealing resin.

Also, because the main electrode pad 113 is electrically connected to the metal layer 122 having a circuit pattern, the present embodiment is suitable for the semiconductor module 100 having the semiconductor chip 110 having a vertical structure.

Also, because the second surface 110*b* of the semiconductor chip 110 is flush with the end surface 130*a* of the guide portion 137 or is on the circuit board 120 side with respect to the end surface 130*a*, the bonding material 124 can be reliably in contact with the metal layer 122 and the main electrode pad 113. That is, reliability excellent with regard to bonding can be obtained.

Second Embodiment

Figure 5A:
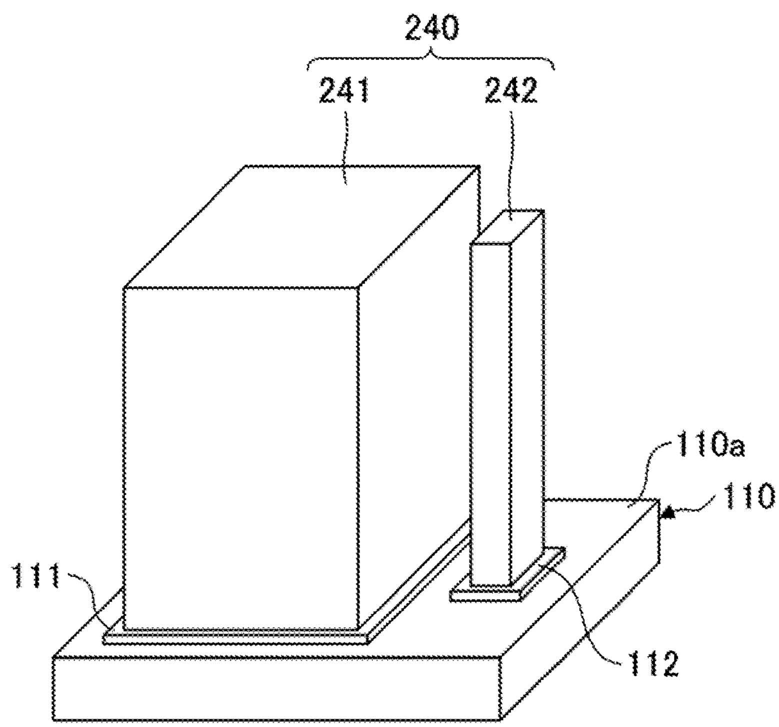
FIG. 5A is a perspective view illustrating the relationship between a main terminal, a control terminal, a main electrode pad, and a control electrode pad in a semiconductor module according to a second embodiment.
Figure 5B:
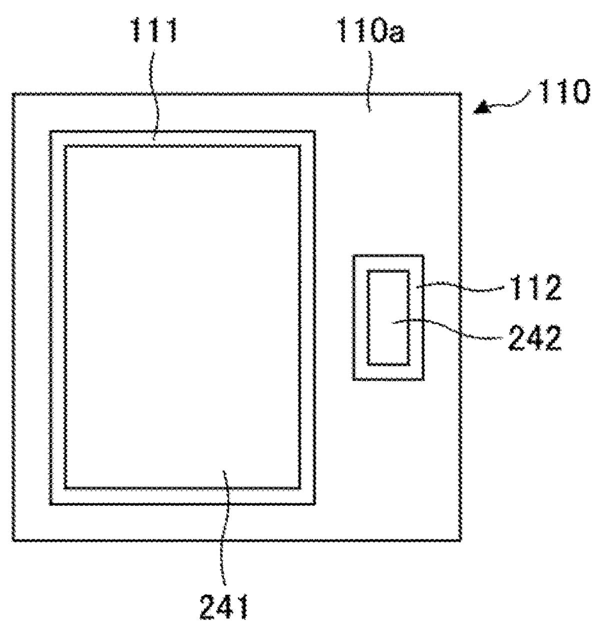
FIG. 5B is a top view illustrating the relationship between the main terminal, the control terminal, the main electrode pad, and the control electrode pad in the semiconductor module according to the second embodiment.

Next, a second embodiment will, be described. The second embodiment differs from the first embodiment in the configuration of the main terminal and the control terminal. FIG. 5A and FIG. 5B are respectively a perspective view and a top view illustrating the relationship between a main terminal, a control terminal, a main electrode pad, and a control electrode pad in a semiconductor module according to the second embodiment.

The semiconductor module according to the second embodiment includes an external terminal 240 instead of the external terminal 140, and the external terminal 240 includes a main terminal 241 and a control terminal 242 that have a prism shape, as illustrated in FIGS. 5A and 5B. The main terminal 241 has a planar shape similar to the planar, shape of the main electrode pad 111, and the area of the surface of the main terminal 241 to be in contact with the main electrode pad 111 is smaller than the area of the surface of the main electrode pad 111 to be in contact with the main terminal 241. The control terminal 242 has a planar shape similar to the planar shape of the control electrode pad 112, and the area of the surface of the control terminal 242 to be in contact with the control electrode pad 112 is smaller than the area of the surface of the control electrode pad 112 to be in contact with the control terminal 242. Other configurations are similar to those of the first embodiment.

The cross-sectional area of the main terminal 241 with respect to the direction in which a current flows can be larger than that of the main terminal 141, and the cross-sectional area of the control terminal 242 with respect to the direction in which a current flows can be larger than that of the control terminal 142. Therefore, according to the second embodiment, it is possible to cause a larger current to flow than in the first embodiment. Also, even when the cross-sectional area of the main terminal 241 and the control terminal 242 is increased, the position of the main terminal 241 can be adjusted with respect to the main electrode pad 111 with high accuracy, and the position of the control terminal. 242 can be adjusted with respect to the control electrode pad 112 with high accuracy.

Third Embodiment

Figure 6A:
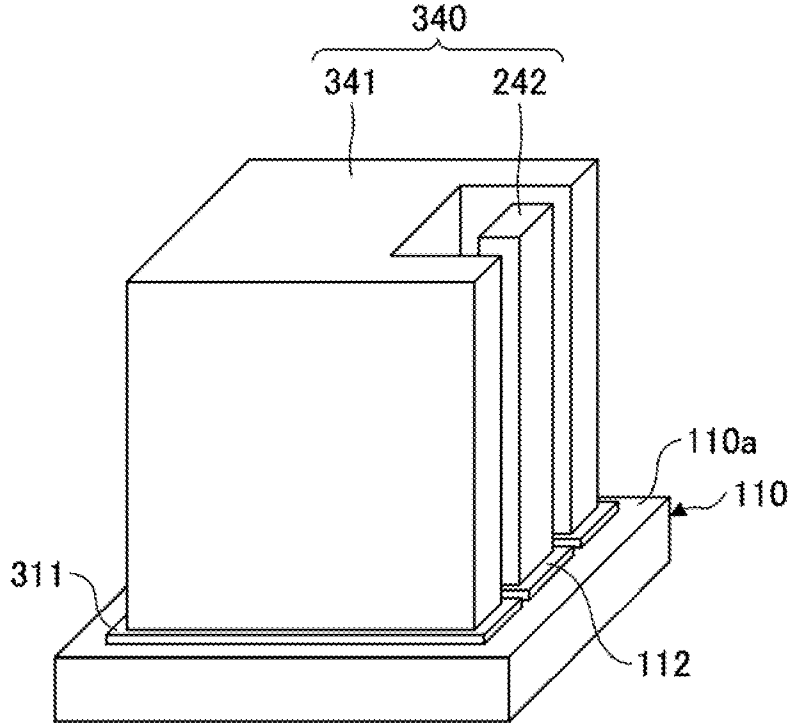
FIG. 6A is a perspective view illustrating the relationship between a main terminal, a control terminal, a main electrode pad, and a control electrode pad in a semiconductor module according to a third embodiment.
Figure 6B:
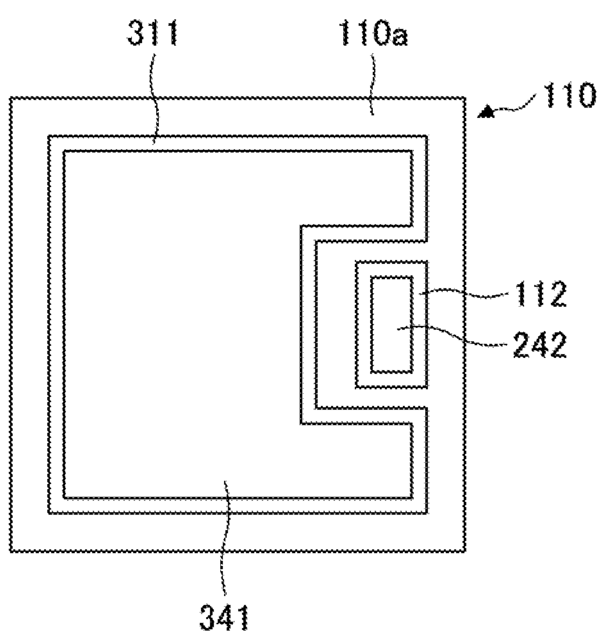
FIG. 6B is a top view illustrating the relationship between the main terminal, the control terminal, the main electrode pad, and the control electrode pad in the semiconductor module according to the third embodiment.

Next, a third embodiment will be described. The third embodiment differs from the first embodiment in the configuration of the main electrode pad and the main terminal. FIG. 6A and FIG. 6B are respectively a perspective view and a top view illustrating the relationship between a main terminal, a control terminal, a main electrode pad, and a control electrode pad in a semiconductor module according to the third embodiment.

The semiconductor module according to the third embodiment includes a main electrode pad 311 instead of the main electrode pad 111, and includes an external terminal 340 instead of the external terminal 140, and the external terminal 340 includes a main terminal 341 and a control terminal 242, as illustrated in FIG. 6A and FIG. 6B. While the planar shape of the main electrode pad 111 is rectangular, in addition to a portion that is the same as the main electrode pad 111, the main electrode pad 311 has a portion extending to both sides of the control electrode pad 112. The main terminal 341 has a planar shape similar to the planar shape of the main electrode pad 311, and the area of the surface of the main terminal 341 to be in contact with the main electrode pad 311 is smaller than the area of the surface of the main electrode pad 311 to be in contact with the main terminal 341. Other configurations are similar to those of the second embodiment.

The cross-sectional area of the main terminal 341 with respect to the direction in which a current flows can be larger than that of the main terminal 241. Therefore, according to the third embodiment, it is possible to cause a larger current to flow than in the second embodiment. Also, even when the cross-sectional area of the main terminal 341 is increased, the position of the main terminal 341 can be adjusted with respect to the main electrode pad 311 with high accuracy.

It should be noted that "similar" in the second and third embodiments does not mean "similar" in a strict sense. It is sufficient to be similar to the extent that it can be regarded as being similar in terms of social belief, and an effect of enabling a large current to flow can be obtained even when it is not similar in a strict sense. For example, a slight difference may tee present in the ratio of side lengths.

Fourth Embodiment

Figure 7:
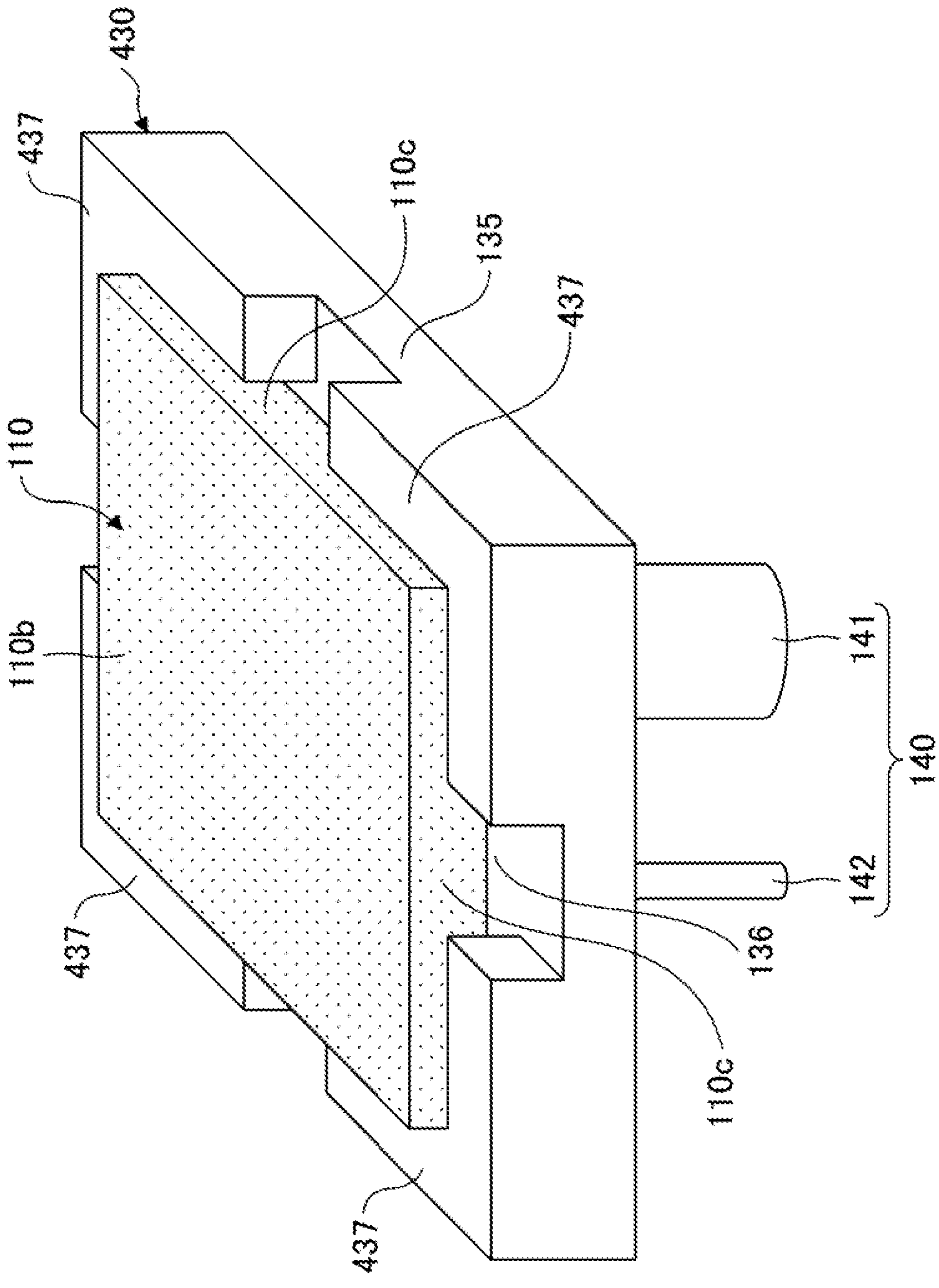
FIG. 7 is a perspective view illustrating a semiconductor chip, an insulating member, and an external terminal in a semiconductor module according to a fourth embodiment.

Next, a fourth embodiment will be described. The fourth embodiment differs from the first embodiment in the configuration of the insulating member. FIG. 7 is a perspective view illustrating a semiconductor chip, an insulating member, and an external terminal in a semiconductor module according to the fourth embodiment.

As illustrated in FIG. 7, the semiconductor module according to the fourth embodiment includes an insulating member 430 instead of the insulating member 130. While the insulating member 130 includes the guide portion 137 that laterally covers the entire periphery of the semiconductor chip 110, the insulating member 430 includes guide portions 437 that laterally cover the respective four corner portions of the semiconductor chip 110. Between the guide portions 437 next to each other, the side surfaces 110*c* of the semiconductor chip 110 are partly exposed from the insulating member 430. Other configurations are similar to those of the first embodiment.

In the fourth embodiment as described above, the semiconductor chip 110 is guided by guide portions 437 of the insulating member 430 to which the main terminal 141 and the control terminal 142 are fixed, the main electrode pad 111 contacts the main terminal 141 and the control electrode pad 112 contacts the control terminal 142. Therefore, similarly to the first embodiment, the position of the main terminal 141 can be adjusted with respect to the main electrode pad 111 with high accuracy and the position of the control terminal 142 can be adjusted with respect to the control electrode pad 112 with high accuracy.

Also, because the insulating member 430 is in contact with the side surfaces 110*c* of the semiconductor chip 110, the side surfaces 110*c*, where high voltage is particularly likely to occur, can be insulation-protected. Although the portions of the side surfaces 110*c* are exposed from the insulating member 430, these portions can be insulation-protected by resin sealing.

Fifth Embodiment

Figure 8:
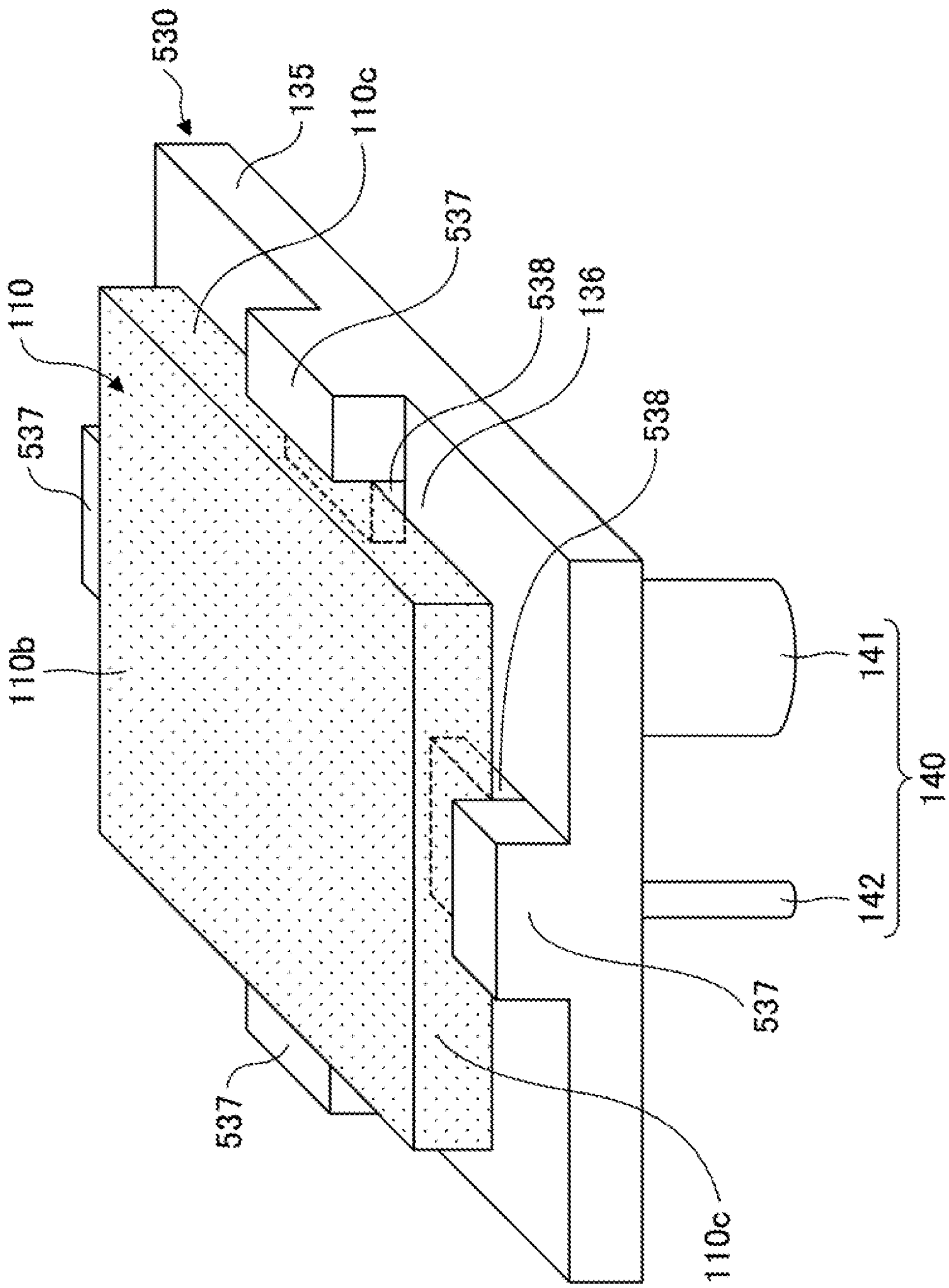
FIG. 8 is a perspective view illustrating a semiconductor chip, an insulating member, and an external terminal in a semiconductor module according to a fifth embodiment.

Next, a fifth embodiment will be described. The fifth embodiment differs from the first embodiment in the configuration of the insulating member. FIG. 8 is a perspective view illustrating a semiconductor chip, an insulating member, and an external terminal in a semiconductor module according to the fifth embodiment.

As illustrated in FIG. 8, the semiconductor module according to the fifth embodiment includes an insulating member 530 instead of the insulating member 130. While the insulating member 130 includes the guide portion 137 that laterally covers the entire periphery of the semiconductor chip 110, the insulting member 530 includes guide portions 537 that laterally covers the central portion of the four side surfaces 110*c* of the semiconductor chip 110. Between the guide portions 537 next to each other, the side surfaces 110*c* including the corner portions of the semiconductor chip 110 are partly exposed from the insulating member 530. Also, instead of the stoppers 138, stoppers 538 are provided inside the respective guide portions 537. Similar to the stoppers 138, the stoppers 538 may have a height such that the sum of the height of the stoppers 538 and the height oldie semiconductor chip 110 is greater than or equal to the depth of the opening portion 136. Other configurations are similar to those of the first embodiment.

In the fifth embodiment as described above, the semiconductor chip 110 is guided by the guide portions 537 of the insulating member 530 to which the main terminal 141 and the control terminal 142 are fixed, the main electrode pad 111 contacts the main terminal 141 and the control electrode pad 112 contacts the control terminal 142. Accordingly, similarly to the first embodiment, the position of the main terminal 141 can be adjusted with respect to the main electrode pad 111 with high accuracy and the position of the control terminal 142 can be adjusted with respect to the control electrode pad 112 with high accuracy.

Also, because the insulating member 530 is in contact with the side surfaces 110*c* of the semi conductor chip 110, the side surfaces 110*c*, where high voltage is particularly likely to occur, can be insulation-protected. Although the portions of the side surfaces 110*c* are exposed from the insulating member 530, these portions can be insulation-protected by resin sealing.

Sixth Embodiment

Figure 9:
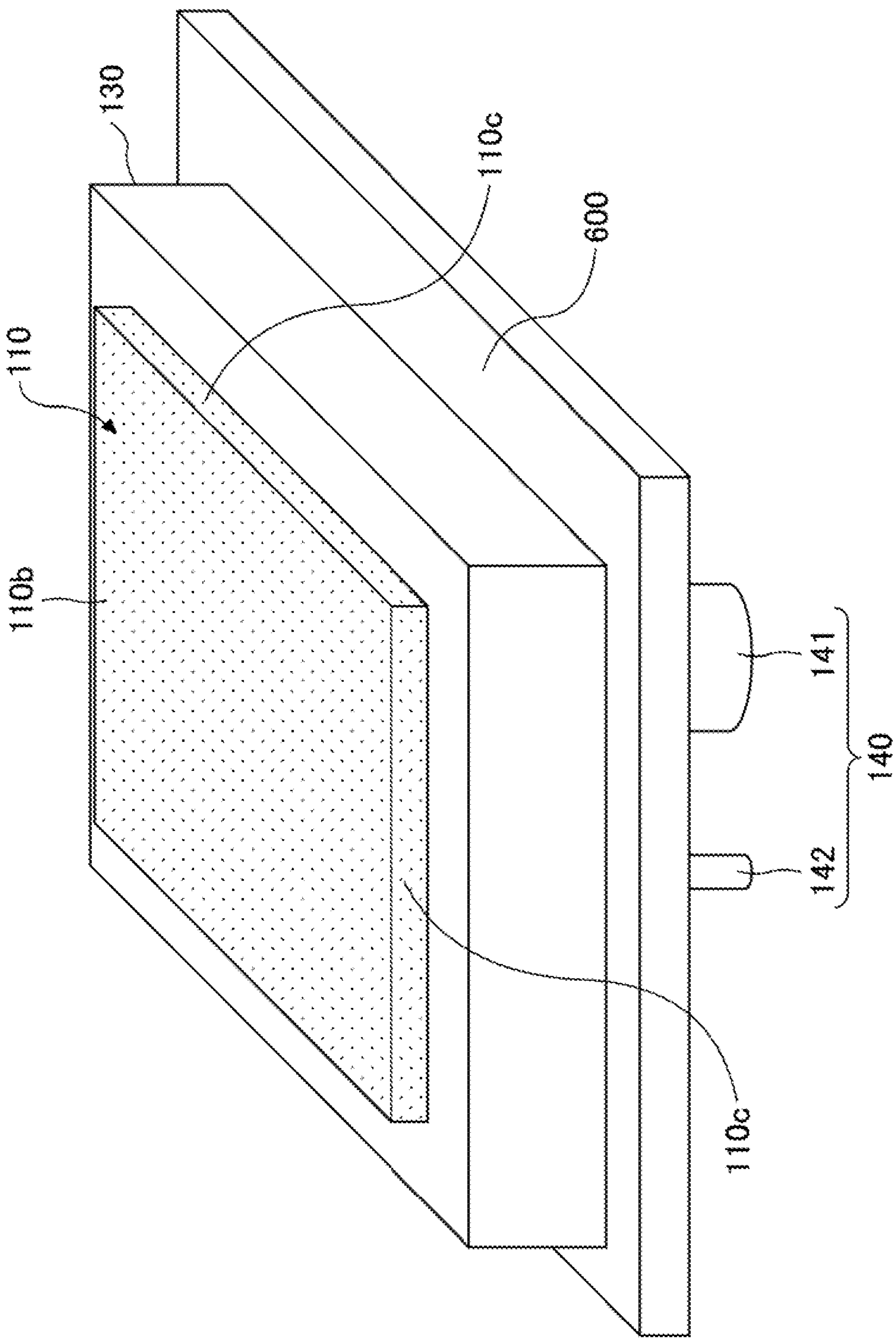
FIG. 9 is a perspective view illustrating a semiconductor chip, an insulating member, an external terminal, and a support member in a semiconductor module according to a sixth embodiment.

Next, a sixth embodiment will be described. The sixth embodiment differs from the first embodiment in that a support member is added. FIG. 9 is a perspective view illustrating a semiconductor chip, an insulating member, an external terminal, and a support member in a semiconductor module according to the sixth embodiment.

The semiconductor module according to the sixth embodiment includes a support member 600 that is provided on the side of the insulating member that is opposite to the circuit board 120 and supports the insulating member 130, as illustrated in FIG. 9. The support member 600 is gripped, for example, at the time of handling the insulating member 130. Also, by using the support member 600 that is wider than the insulating member 130, it is also possible to support a plurality of insulating members 130 by the single support member 600 and to adjust the position of the external terminals 140 with respect to the plurality of semiconductor chips 110 with high accuracy at the same time.

For example, the support member 600 can be made of a material that is the same as the insulating member 130. That is, the support member 600 is made of ceramics such as alumina or an organic resin such as PPS.

in any of the first to sixth embodiments, the opening portion 136 may be filled with an insulating material, such as a resin.

Although the embodiments have been described in detail above, it is not limited to a specific embodiment Various modifications and changes can be made within a scope set forth in the claims.

DESCRIPTION OF THE REFERENCE NUMERALS

100 semiconductor module
110 semiconductor chip
110*a* first surface.
110*b* second surface
110*c* side surface
111 main electrode pad
112 control electrode pad
113 main electrode pad
120 circuit board
120*a* first surface:
120*b* second surface
121 insulator substrate
122 metal layer
123 metal layer
124 bonding material
126 gap
130 insulating member
130*a* end surface
131 main terminal through hole
182 control terminal through hole
135 base portion
136 opening portion
137 guide portion
138 stopper
140 external terminal
141 main terminal
142 control terminal
240 external terminal
241 main terminal
242 control terminal
311 main electrode pad
341 main terminal
430 insulating member
437 guide portion
530 insulating member
537 guide portion
538 stopper
600 support member

The invention claimed is:

1. A semiconductor module comprising:

a circuit board;

a semiconductor chip having a first electrode pad on a first surface, bonded to the circuit board at a second surface that is opposite to the first surface, and having side surfaces intersecting the first surface and the second surface;

an external terminal electrically connected to the first electrode pad; and an insulating member configured to fix the external terminal, wherein by the insulating member contacting the side surfaces of the semiconductor chip at a plurality of locations, parallel movement and rotational movement of the semiconductor chip relative to the insulating member in a plane parallel to the first surface are restricted, and wherein the external terminal penetrates the insulating member by extending straight from a third surface of the insulating member to a fourth surface of the insulating member, the third surface being opposite to the fourth surface.

2. The semiconductor module according to claim 1, wherein the first surface of the semiconductor chip is covered by the insulating member, and wherein the external terminal penetrates the insulating member in a direction perpendicular to the first surface.

3. The semiconductor module according to claim 1, wherein a surface of the external terminal to be in contact with the first electrode pad has a shape similar to a shape of a surface of the first electrode pad to be in contact with the external terminal.

4. The semiconductor module according to claim 1, wherein the insulating member is in contact with the side surfaces over an entire periphery of the semiconductor chip.

5. The semiconductor module according to claim 1, wherein a planar shape of the semiconductor chip is a quadrilateral, and wherein the insulating member is in contact with at least one location for each of the side surfaces corresponding to respective sides of the quadrilateral.

6. The semiconductor module according to claim 1, wherein the circuit board has a circuit pattern on a surface toward the semiconductor chip, wherein the semiconductor chip has a second electrode pad on the second surface, and wherein the second electrode pad is electrically connected to the circuit pattern.

7. The semiconductor module according to claim 1, the semiconductor chip is made of a material including SiC.

8. A semiconductor module comprising:

a circuit board;

a semiconductor chip having a main electrode pad and a control electrode pad on a first surface, bonded to the circuit board at a second surface that is opposite to the first surface, and having side surfaces intersecting the first surface and the second surface;

a main terminal electrically connected to the main electrode pad;

a control terminal electrically connected to the control electrode pad; and an insulating member configured to fix the main terminal and the control terminal, wherein the first surface of the semiconductor chip is covered by the insulating member, wherein by the insulating member contacting an entire periphery of the side surfaces of the semiconductor chip, parallel movement and rotational movement of the semiconductor chip relative to the insulating member in a plane parallel to the first surface are restricted, and wherein the main terminal and the control terminal penetrate the insulating member in a direction perpendicular to the first surface by extending straight from a third surface of the insulating member to a fourth surface of the insulating member, the third surface being opposite to the fourth surface.

9. A semiconductor module comprising:

a circuit board;

a semiconductor chip having a first electrode pad on a first surface, bonded to the circuit board at a second surface that is opposite to the first surface, and having side surfaces intersecting the first surface and the second surface;

an external terminal electrically connected to the first electrode pad; and an insulating member configured to fix the external terminal, wherein by the insulating member contacting the side surfaces of the semiconductor chip at a plurality of locations, parallel movement and rotational movement of the semiconductor chip relative to the insulating member in a plane parallel to the first surface are restricted, wherein the first surface of the semiconductor chip is covered by the insulating member, wherein the external terminal penetrates the insulating member in a direction perpendicular to the first surface by extending straight from a third surface of the insulating member to a fourth surface of the insulating member, the third surface being opposite to the fourth surface, wherein a planar shape of the semiconductor chip is a quadrilateral, and wherein the insulating member is in contact with at least one location for each of the side surfaces corresponding to respective sides of the quadrilateral.

* * * * *